United States Patent
Emigh et al.

(10) Patent No.: US 11,921,948 B2
(45) Date of Patent: *Mar. 5, 2024

(54) TOUCH-BASED CONTROL DEVICE

(71) Applicant: Brilliant Home Technology, Inc., San Mateo, CA (US)

(72) Inventors: Aaron T. Emigh, San Mateo, CA (US); Steven Stanek, San Mateo, CA (US); Brian Cardanha, San Mateo, CA (US); Bozhi See, San Mateo, CA (US); Iris Yan, San Mateo, CA (US); Gaurav Hardikar, San Mateo, CA (US)

(73) Assignee: Brilliant Home Technology, Inc., San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,477

(22) Filed: Oct. 26, 2022

(65) Prior Publication Data

US 2023/0044270 A1    Feb. 9, 2023

Related U.S. Application Data

(63) Continuation of application No. 17/141,972, filed on Jan. 5, 2021, now Pat. No. 11,507,217.

(Continued)

(51) Int. Cl.
*G06F 3/041*    (2006.01)
*G05B 15/02*    (2006.01)
(Continued)

(52) U.S. Cl.
CPC .......... *G06F 3/0416* (2013.01); *G05B 15/02* (2013.01); *G06F 3/0443* (2019.05); *H03K 17/9618* (2013.01); *F21V 23/0485* (2013.01)

(58) Field of Classification Search
CPC .... G06F 3/0416; G06F 3/0443; G06F 3/0488; G06F 3/017; G06F 3/0219;
(Continued)

(56) References Cited

U.S. PATENT DOCUMENTS 9,208,676 B2    12/2015    Fadell et al.
9,614,690 B2    4/2017    Ehsani et al.
(Continued)

FOREIGN PATENT DOCUMENTS

CN    107229230 A    10/2017
EP    3073338 A1    9/2016
(Continued)

OTHER PUBLICATIONS

International Search Report and The Written Opinion of The International Searching Authority dated Apr. 18, 2019, for related PCT Application No. PCT/US19/012698 filed Jan. 8, 2019, 7 pages.

(Continued)

*Primary Examiner* — Ryan A Lubit
(74) *Attorney, Agent, or Firm* — Mahamedi IP Law LLP

(57) ABSTRACT

A control device includes an exterior panel comprising multiple regions, including a groove region and a surrounding region that surrounds the groove region. The control device further includes a sensor layer comprising one or more sensors to detect touch inputs performed on the groove region and the surrounding region of the exterior panel. The control device further includes a control module configured to operate a plurality of devices. The control module is configured to detect a first touch input performed by a user on the groove region and a second touch input performed on the surrounding region. Based at least in part on the location of the touch inputs the control module operates respective devices of the plurality of devices.

20 Claims, 9 Drawing Sheets

Related U.S. Application Data

(60) Provisional application No. 62/957,302, filed on Jan. 5, 2020, provisional application No. 62/957,294, filed on Jan. 5, 2020, provisional application No. 62/957,297, filed on Jan. 5, 2020.

(51) Int. Cl.
*G06F 3/044* (2006.01)
*H03K 17/96* (2006.01)
*F21V 23/04* (2006.01)

(58) Field of Classification Search
CPC .............. G06F 3/04883; G06F 3/0414; H03K 17/9618; H03K 17/9622; H03K 17/96; H03K 2217/94089; H03K 2217/94094; H04L 12/282; H04L 12/2827; H04L 12/2829; G05B 15/02; G05B 2219/2642; G08C 17/00; G08C 17/02
See application file for complete search history.

(56) References Cited

U.S. PATENT DOCUMENTS

| | | | |
|---|---|---|---|
| 9,835,434 B1 | 12/2017 | Sloo | |
| 10,375,897 B2 | 8/2019 | Reilly | |
| 11,507,217 B2* | 11/2022 | Emigh | ............... H03K 17/9618 |
| 2002/0016639 A1 | 2/2002 | Smith | |
| 2003/0040812 A1 | 2/2003 | Gonzales | |
| 2006/0132303 A1 | 6/2006 | Stilp | |
| 2006/0212136 A1 | 9/2006 | Lee | |
| 2008/0158172 A1 | 7/2008 | Hotelling | |
| 2009/0158188 A1 | 6/2009 | Bray | |
| 2010/0001746 A1 | 1/2010 | Duchene et al. | |
| 2010/0146423 A1 | 6/2010 | Duchene | |
| 2011/0063224 A1 | 3/2011 | Vexo | |
| 2011/0137836 A1 | 6/2011 | Kuriyama | |
| 2012/0259992 A1 | 10/2012 | Koehler | |
| 2012/0310415 A1 | 12/2012 | Raestik | |
| 2013/0131839 A1 | 5/2013 | Washington | |
| 2014/0006465 A1 | 1/2014 | Davis | |
| 2014/0108019 A1 | 4/2014 | Ehsani | |
| 2014/0201666 A1 | 7/2014 | Bedikian | |
| 2014/0253483 A1 | 9/2014 | Kupersztoch | |
| 2014/0257532 A1 | 9/2014 | Kim | |
| 2014/0292396 A1 | 10/2014 | Bruwer | |
| 2015/0077343 A1 | 3/2015 | Shao | |
| 2015/0097780 A1 | 4/2015 | Hotelling | |
| 2015/0156031 A1 | 6/2015 | Fadell | |
| 2015/0163412 A1 | 6/2015 | Holley | |
| 2015/0187209 A1 | 7/2015 | Brandt | |
| 2015/0241860 A1 | 8/2015 | Raid | |
| 2016/0012348 A1* | 1/2016 | Johnson | ................. G06N 20/20 706/12 |
| 2016/0025367 A1 | 1/2016 | Matsuoka et al. | |
| 2016/0043926 A1 | 2/2016 | Frei | |
| 2016/0259308 A1 | 9/2016 | Fadell | |
| 2016/0277203 A1 | 9/2016 | Jin | |
| 2016/0277204 A1 | 9/2016 | Kang | |
| 2017/0005818 A1 | 1/2017 | Gould | |
| 2017/0006504 A1 | 1/2017 | Townend | |
| 2017/0017324 A1* | 1/2017 | O'Keeffe | .............. G06F 3/0412 |
| 2017/0019265 A1 | 1/2017 | Hou | |
| 2017/0026194 A1 | 1/2017 | Vijayrao et al. | |
| 2017/0131891 A1* | 5/2017 | Novet | ..................... G06F 3/044 |
| 2017/0195130 A1 | 7/2017 | Landow et al. | |
| 2017/0292712 A1 | 10/2017 | Alexander | |
| 2017/0339004 A1 | 11/2017 | Hall | |
| 2017/0357439 A1 | 12/2017 | Lemay | |
| 2017/0359190 A1 | 12/2017 | Nadathur | |
| 2018/0052451 A1 | 2/2018 | Billi-Duran | |
| 2018/0091326 A1 | 3/2018 | McLaughlin | |
| 2018/0191517 A1* | 7/2018 | Emigh | ................ G06F 3/04883 |
| 2018/0292962 A1 | 10/2018 | Choi | |
| 2018/0300645 A1 | 10/2018 | Segal | |
| 2018/0323996 A1 | 11/2018 | Roman | |
| 2019/0029096 A1* | 1/2019 | O'Driscoll | ............. H05B 47/19 |
| 2019/0035567 A1 | 1/2019 | O'Keeffe | |
| 2019/0215184 A1 | 7/2019 | Emigh | |
| 2019/0229943 A1 | 7/2019 | Edwards | |
| 2019/0280891 A1 | 9/2019 | Pognant | |
| 2019/0371145 A1* | 12/2019 | McQueen | ............. H04L 63/162 |
| 2020/0028734 A1 | 1/2020 | Emigh | |
| 2021/0019284 A1 | 1/2021 | Bowman | |
| 2021/0194758 A1 | 6/2021 | Emigh | |
| 2021/0208723 A1 | 7/2021 | Emigh | |
| 2021/0208724 A1 | 7/2021 | Emigh | |
| 2021/0210939 A1 | 7/2021 | Emigh | |
| 2021/0211319 A1 | 7/2021 | See | |
| 2021/0218399 A1 | 7/2021 | Cardanha | |
| 2022/0006664 A1 | 1/2022 | Emigh | |
| 2022/0224596 A1 | 7/2022 | Emigh | |
| 2023/0019612 A1 | 1/2023 | See | |
| 2023/0044270 A1 | 2/2023 | Emigh | |

FOREIGN PATENT DOCUMENTS

| | | |
|---|---|---|
| EP | 3131235 A1 | 2/2017 |
| EP | 2887166 B1 | 7/2019 |
| WO | WO-2017/107521 | 6/2017 |
| WO | WO-2017/192752 | 11/2017 |
| WO | WO-2018/129105 | 7/2018 |
| WO | WO-2019/136440 | 7/2019 |
| WO | WO-2020/018995 | 1/2020 |

OTHER PUBLICATIONS

International Search Report and The Written Opinion of The International Searching Authority dated Nov. 14, 2019, for related PCT Application No. PCT/US19/42843 filed Jul. 22, 2019, 8 pages.
International Search Report and The Written Opinion of The International Searching Authority dated Feb. 25, 2021, for related PCT Application No. PCT/US21/12214 filed Jan. 5, 2021, 8 pages.
Extended European Search Report dated Mar. 9, 2022, Application No. 19837970.3 11 pages.
Extended European Search Report dated Dec. 12, 2023, Application No. 21736185.6-1211 8 pages.

* cited by examiner

TOUCH-BASED CONTROL DEVICE

RELATED APPLICATIONS

This application is a continuation of U.S. patent application Ser. No. 17/141,972, filed on Jan. 5, 2021; which claims benefit of priority to each of (i) Provisional U.S. Patent Application No. 62/957,294, filed Jan. 5, 2020; (ii) Provisional U.S. Patent Application No. 62/957,297, filed Jan. 5, 2020; and (iii) Provisional U.S. Patent Application No. 62/957,302, filed Jan. 5, 2020. Each of the aforementioned applications are hereby incorporated by reference in their respective entireties.

TECHNICAL FIELD

This applications relates to control devices, and more specifically, touch-based control devices.

BACKGROUND

Home control systems, such as lighting control systems used for lighting fixtures, include binary analog switches and analog dimmer switches that enable users to control one or more lights wired to an electrical box upon which such switches are connected. Furthermore, when a person wishes to activate or interact with home systems, the person typically must interact with an actual device of the system or a dedicated or universal remote control and manually create an environment comprising activated or dimmed lights, audio system output, visual system output (e.g., a television or digital picture frame output), temperature, and the like.

BRIEF DESCRIPTION OF THE DRAWINGS

The disclosure herein is illustrated by way of example, and not by way of limitation, in the figures of the accompanying drawings in which like reference numerals refer to similar elements, and in which.

DETAILED DESCRIPTION

Figure 1A:
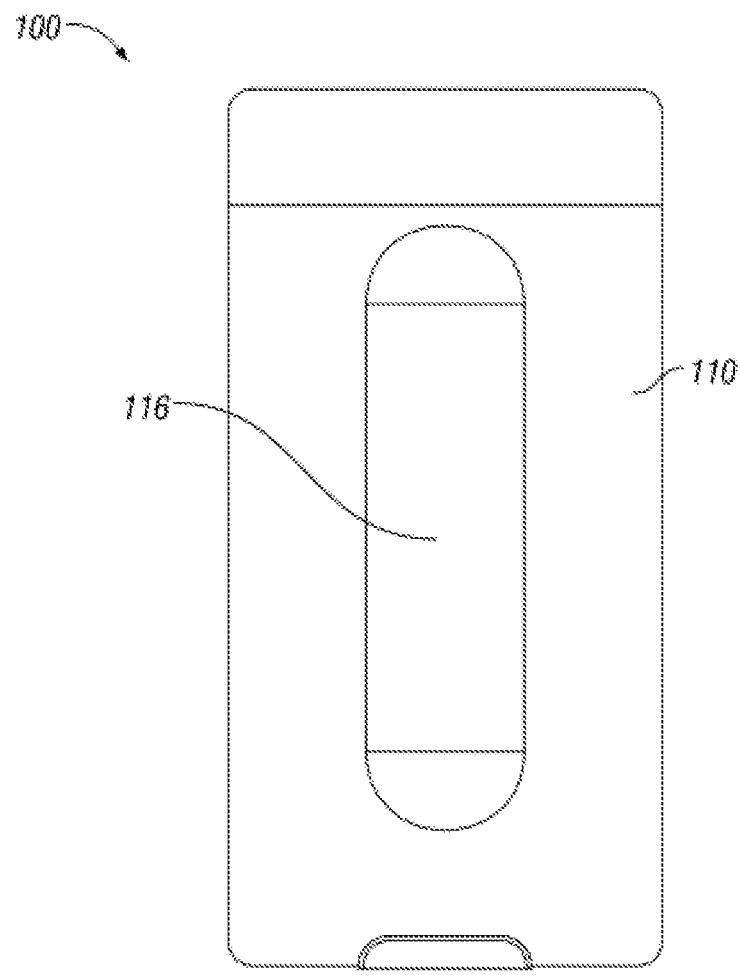
FIG. 1A and FIG. 1B illustrate a control device, according to one or more examples.

In various embodiments, a touch-based control device includes an exterior panel and a control module coupled to the exterior panel, where the control module is capable of detecting and interpreting touch input that is received on any location over at least a substantial portion of the exterior panel. In other aspects, the control module can be configured with the exterior panel to detect touch input on any location of the exterior panel. In various examples, the control module detects and interprets the touch inputs from the user based on at least one of a location where the touch input occurred and/or a type of the touch input.

According to examples, a touch-based control device includes an exterior panel, one or more touch sensors, and a control module. The control module interprets a touch input that is received on the exterior panel to control a set of controlled devices. In examples, the touch input is interpreted based on (i) a location where the touch input occurred, and/or (ii) a type of the touch input.

In some examples, the touch-based control device is a wall-mounted device that is responsive to touch inputs received on any location of the exterior panel, such as in a corner or perimeter region of the exterior panel. The control device can interpret the touch input as a command to control one or more connected devices.

Additionally, in examples, a touch-based control device includes a three-dimensional input feature, such as a touch groove. The control device can detect and interpret a first type of touch input received within the touch groove to perform a first type of command (e.g., set power level or other range value). Additionally, the control device can detect and interpret a second type of touch input received at any surrounding panel region of the exterior panel as a second type of command (e.g., select connected device to control, turn connected device on or off, etc.).

In variations, an example touch-based control device includes an exterior panel with multiple types of touch-sensitive input regions. In an example, a touch-based control device includes one or multiple touch-input grooves, and the touch-based control device is receptive to touch within the groove and/or touch along the groove. In such examples, a touch-based control device operates to detect and interpret touch input received on either a touch-input groove or on a surrounding panel region about the touch input groove. In some examples, a touch input received on a touch-input groove can be interpreted differently as compared to a touch input received on the surrounding panel region. For example, a touch input detected on an input groove can be interpreted as a range value input, while a touch input received on the surrounding panel region can be interpreted as input to power a connected or device of the control device between a high and low power state (e.g., on/off).

The terms "substantial" or "substantially", as used with examples described herein, means at least 80% of an indicated quantity (e.g., such as an area of an exterior panel).

In some examples, a touch-based control device includes a touch groove that can detect and interpret a first type of input (e.g., swipe along a length of the input groove) while surrounding panel region can receive a second type of input (e.g., tap, or double-tap). In response to sensing a touch input in either the touch groove or the surrounding panel region, the touch-based control device performs an output function to control a connected device based on the touch input.

In certain embodiments, the touch-based control device includes or corresponds to a home device controller for controlling one or more devices of a dwelling. In examples, the control device can be used to control a set of devices, including one or more devices selected from a group that includes a lighting device, a ceiling fan, a thermostat, an appliance, a security camera, a security system, a door lock, a television, an audio (or media) system, or other types of devices. By way of example, the touch-based control device includes or corresponds to a light controller to control a set of lights within a dwelling.

Still further, in some examples, the touch-based control device can be implemented as a wall-mounted control device (e.g., light switch) that interprets touch inputs from users and processes the touch inputs to control a set of devices (e.g., lights within a room of a dwelling). In such an example, the touch-based control device can interpret one or more user inputs on the surrounding panel region to control on/off functions of a set of connected devices. Additionally, the touch-based control device can interpret one or more user inputs received on the touch groove as a range value input (e.g., brightness or power level).

Still further, some examples provide for a base assembly that can combine with an exterior panel to form a wall-mountable control device. In such examples, the base assembly includes a control module that includes a sensor layer, and the control module is structured to position the sensor layer near a surface where the exterior panel is to be provided.

Touch-based Control Device

Figure 1B:
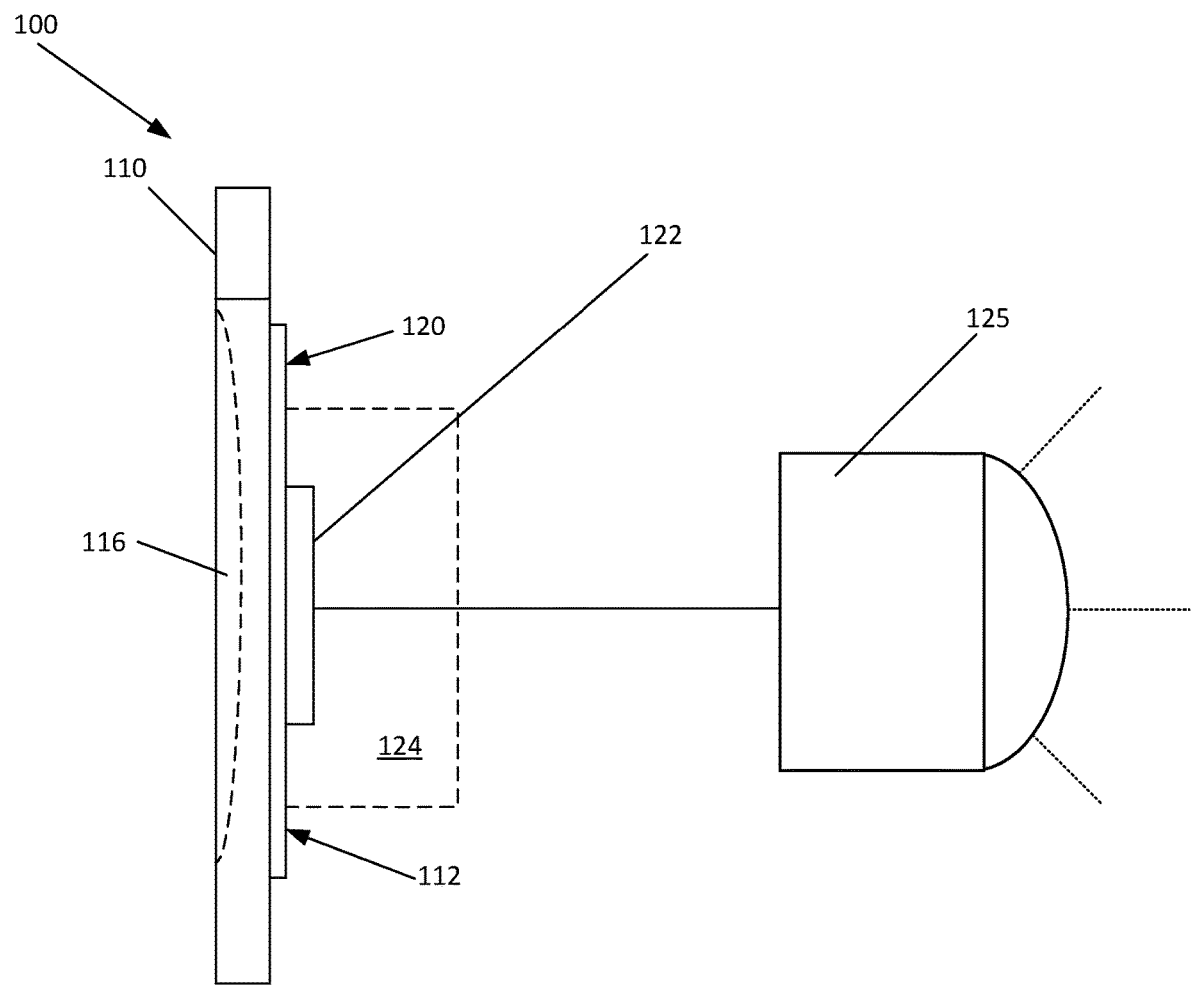

FIG. 1A and FIG. 1B illustrate a touch-based control device, according to one or more examples. An example touch-based control device 100 includes an exterior panel 110 that overlays a control module 120. As described with some examples, the control device 100 can be wall-mounted or otherwise provided in a dwelling or room to control other devices based on gesture and touch input of the user. In examples, the exterior panel 110 overlays touch sensors (e.g., a layer of capacitive sensors), such that touch input can be detected and interpreted at various locations over a substantial portion of the exterior panel 110. Sill further, the control device 100 can be structured to detect touch input which is received at any location of the exterior panel 110.

In some examples as shown, the exterior panel 110 includes a touch groove 116 which designates a region where a user can provide a particular type of touch input. In variations, the exterior panel 110 includes multiple input grooves that designate areas where touch input can be received. In variations, other forms of three-dimensional touch input features can be used in place of or in addition to the touch groove 116. As an addition or alternative, the exterior panel 110 can also be operated by the user with various touch inputs and gestures.

According to examples, the control device 100 an exterior panel 110 and a base assembly 112 that includes a control module 120. The control device 100 can be wall-mounted, with the base assembly 112 being provided within, for example, a wall receptable or recess, and the panel 110 forming a thickness over the corresponding wall. In such examples, the base assembly 112 can further include an electrical interface 122 to electrically connect the control device 100 to a power supply line of a dwelling. The electrical interface 122 can include wiring and switching elements to enable control module 120 to generate a switching output that controls the configuration of the switching elements of the electrical interface 122.

As described with some examples, the controlled devices 125 can include load devices and connected devices. Load devices refer to devices which have power supply lines (sometimes referred to as "load lines") that are controllable by the control device. Controlled devices refer to devices that have wireless or wireline communication interfaces that can receive commands from the control device 100. Still further, controlled devices can include devices that can be controlled through power supply switching and commands. For example, many conventional-type load devices include wireless receivers (e.g., WiFi-enabled lighting devices), and some types of devices can receive communications through a powerline communication medium. In examples, the control device 100 can implement a predetermined setting (or settings) that corresponds to an operational aspect of a controlled device using switching configurations on power supply lines of load devices and/or commands signaled through wireless or wireline mediums of connected devices.

The control device 100 can control the operational aspect of a load device by controlling a power supply to the respective device. For example, the controlled device(s) 125 can include a set of load devices (e.g., light switch, ceiling fan, thermostat, etc.) which connect directly to a power line of a dwelling. In such cases, the control device 100 can be wall-mounted to function as a switch (e.g., light switch) that controls the power supply to such devices. Through control of the power supply, the control device 100 can control operational aspects of load devices, such as whether the load devices are on or off and/or the operational level of the load devices (e.g., dim level of lights, fan speed of ceiling fan, etc.). By way of example, the control device 100 can implement one or more switching type operations to control operational aspects such as on/off and power levels (e.g., dimmed lights, ceiling fan speed, etc.) of the load devices. The control device 100 can implement the switching operations or configurations via, for example, switching elements of the electrical interface 122.

As an addition or variation, the control device 100 controls the operational aspect of one or more controlled devices 125 by performing operations that include signaling one or more commands to the controlled device(s) 125, where the commands cause the controlled device to implement a particular operational aspect. In some examples, the control device includes a wireless transceiver that can wirelessly signal commands to the controlled device 125, either directly or indirectly through an intermediate device. As an addition or variation, the control device 100 can signal commands to the controlled device using a wireline connection.

In some examples, the control device 100 can have a primary function of operating as a light switch to control a set of connected lights. As described with some examples, the touch-based control device 100 can also control one or more devices (e.g., appliance) via a wireless interface.

The exterior panel 110 can include multiple input regions where touch input can be detected and interpreted. In some examples, the input regions of the exterior panel 110 include touch groove 116, and one or more regions that surround the touch groove 116. The touch groove 116 can be structured as an elongated (e.g., vertically elongated) indentation within the exterior panel 110, and the surrounding region(s) of the touch panel can be flat or substantially two-dimensional. In such examples, the control device 100 can receive touch input within or on the touch groove 116 (e.g., swipe in direction of groove), as well as on the surrounding regions to the touch groove 116. The control device 100 can further map or otherwise interpret touch input differently, depending on whether the particular region where the input is received. For example, a touch input received within the touch groove 116 can be interpreted as a first command, while a touch input received on the surrounding regions of the exterior panel 110 can be interpreted as a second command.

Still further, in some examples, the control device 100 can detect and interpret touch input received at any location of the exterior panel 110. Thus, for example, a touch input can be received or extended on or near a corner or perimeter region of the exterior panel 110. The control device 100 can respond by implementing an output operation that controls an operational aspect of a device or set of devices.

In variations, the exterior panel 110 may not have touch groove 116, but instead comprise a flat panel formed of the same material as a remainder of the exterior panel portion 110. For example, the control device 100 may have a substantially planar surface operatively coupled to an underlying sensor layer of the control module 120, as described with FIG. 2A through FIG. 2C.

Still further, in variations, the exterior panel 110 lacks a display surface. Thus, in such examples, the control device 100 can detect and interpret touch input at any location of a display-less exterior panel 110, and with or without touch grooves or other surface features, as the case may be.

With respect to examples as described, the control device 100 can determine characteristics of a touch input from which the control device 100 can detect and determine input. Further, the control device 100 can map or otherwise interpret the detected gesture as a specific input. In response, the control device 100 can implement an operation one or more operations (e.g., switching functions, command transmissions) to control operational aspects of one or more controlled devices 125. By way of example, the control device 100 can control operational aspects of a set of controlled devices 125 in a dwelling (e.g., room in house), where the set of controlled devices 125 can include one or more devices selected from a group that includes a lighting device, a ceiling fan, a thermostat, an appliance, a security camera, a security system, a door lock, a television, an audio (or media) system, or other types of devices.

In certain implementations, the control device 100 can be implemented as a wall-mounted control device that interprets touch inputs from users, and further interprets detected touch inputs to control operational aspects of a set of controlled devices 125. As an addition or variation, the control device 100 detects touch input as gestures, and further control operation aspects of multiple controlled devices 125 at one time based on the detected gestures. Still further, as described with some examples, the control device 100 implements a scene in response to detecting corresponding touch inputs on the exterior panel 110. For control device 100, each scene can represent (i) a selection of one or more devices of a set of controlled devices 125, and (ii) an operational setting of each controlled device 125 of the selection. The control device 100 can associate a gesture with a scene, such that when the control device 100 detects the user providing a touch input that is detected as the gesture, the control device 100 automatically implements the scene. By implementing the scene, the control device 100 performs operations which result in implementation of the operational aspect of each controlled device 125, such that each controlled device operates at a particular setting or set of settings. The control device 100 can implement the operational aspect by, for example, controlling a power supply for the controlled device 125 (e.g., lights) and/or by sending one or more commands to individual devices of the selection, to cause each of the respective devices to operate with the predetermined operational setting.

With reference to FIG. 1B, the control device 100 includes exterior panel 110 with touch groove 116 (shown in phantom) and control module 120. In certain examples, the control module 120 can include touch-sensitive sensors that enable the control module 120 to detect gesture and other inputs received on the exterior panel 110. The control module 120 can further include control logic, circuity, sensors and other configurations for detecting touch input at any location on the exterior panel 110, and for interpreting the touch input as a gesture. The control module 120 can be configured to detect and interpret any one of multiple gestures, where each gesture is associated with a command or set of commands. Thus, for example, the control device 100 can be capable of detecting multiple touch inputs or gestures Additionally, in various examples, the control module 120 includes an electrical interface 122 to connect the control module 120 to electrical switching elements that control a power supply to one or more controlled devices 125. When mounted to an underlying wall, the electrical interface 122 can be connected to the electrical and switching elements, which can be housed within an electrical box 124 (e.g., a gang-box of an existing light switch panel). The control module 120 can be mounted against the wall, and the exterior panel 110 can form a façade or faceplate for the control module 120. In certain examples, the touch-based control device 100 can be mounted to replace existing light switch panels of a dwelling, such as analog light switches common in the art.

In implementations, the control module 120 includes a circuit board that includes touch-sensitive sensors that generate reactive signals in response to touch inputs performed on the control device 100. In some aspects, the control module 120 can be configured to sense touch inputs anywhere on the exterior panel 110. The control module 120 includes capacitive sensors that can detect change in an electric field about any point on the exterior panel 110 of the touch-based control device 100. The touch-based control device 100 can further include logic to correlate the detected changes in electric field to touch inputs of the user, and further, in some examples, to characteristics of the user's touch inputs.

In further aspects, the sensors may also determine one or more characteristics of the touch input. The detected characteristics of the touch input can correspond to, for example, (i) a direction of the movement, (ii) a length of movement, (iii) a linear or two-dimensional path (or shape) of the touch input, (iv) a duration of the touch input, (v) a time interval between discrete touches of the touch input, (vi) a velocity or acceleration of movement of the touch input, and/or (vii) other characteristics determined of the touch input. Still further, in some variations, the determined characteristics of the touch input can correspond to a touch force exerted on the surface (e.g., such as may be detected by use of a force sensor), a velocity of the touch input (e.g., speed of a swipe), and/or acceleration of the touch input. The control module 120 can include memory storing sensor logic executable by processing resources to interpret the reactive signals. In certain implementations, execution of the sensor logic can cause the control module 120 to identify locations on the exterior panel 110 where a touch input occurs and interpret the touch input a gesture, or a set of gestures, to control one or more functions of the controlled device 125.

The control device 100 can also include wireless communication resources to enable wireless communications with one or more controlled devices 125. The circuit board of the control module 120 can include one or more wireless transceivers and associated logic (e.g., a wireless chip) to enable the control module 120 to receive instructions and data from a user's mobile device, a base station controller, and/or other controllable devices. In certain examples, a wireless transceiver of the control device 100 can also communicate commands and other information to one or more controlled devices 125 using Bluetooth, Wi-Fi, cellular or other wireless communication channel. Once the control device 100 is installed and configured to control a group of controlled devices 125, the user can further operate an application on a mobile computing device to connect with the control device 100 and configure the control device 100 using, for example, a Bluetooth or WiFi connection formed via a wireless transceiver of the control module 120.

Embodiments recognize that human touch may be irregular and imprecise, and considerable variation in touch inputs may exist between users. According to various examples, the control module 120 can accurately interpret instances when the user's touch input is a tap input (e.g., single tap, double tap, tap pattern, etc.), slide input (e.g., short side, long slide, 'S' or other similar gesture), or other type of touch input (e.g., tap and hold). Still further, the control module 120 can include logic to detect different touch inputs from different users (e.g., users of a household), when variations amongst different users may exist. For example, the control module 120 can define a touch input as a tap input or a slide input based on one or more characteristics of the touch input, including characteristics corresponding to an amount or distance of movement occurring when the user contacts the panel 110, whether any linear movement in the touch input occurs as opposed to an incidental touch, a contact duration of the touch input, an initial location of the touch input, an ending location of the touch input, whether the touch input occurs within the touch groove 116 or wholly on the exterior panel 110, and the like.

According to certain implementations, the control module 120 can include computing resources such as one or more processors and memory storing executable instructions that implement the interpretive and control functions described herein. In variations, the control module 120 can comprise dedicated circuitry, such as one or more application-specific integrated circuits (ASICs) or a configured field-programmable gate array (FPGA) that perform the interpretation and control functions described herein. In either case, the control module 120 can perform conflict resolution actions that decipher sensory inputs performed on the touch-based control device 100, determine a control action to perform on the controlled device(s) 125, and execute the control action accordingly for each touch input.

In various implementations, the control module 120 can determine which control operation to perform (e.g., on/off, mode selection, device selection, range value setting, etc.) based on whether the touch input is interpreted as a tap or a slide. For example, if the control module 120 interprets a touch input as a tap the control module 120 can implement a switching operation via the electrical interface 122 to switch the load device(s). The switching operation can have the effect of switching the connected device(s) from an on state to an off state, or from the off state to the on state.

In contrast, if the control module 120 interprets the touch input as a slide, the control module 120 can implement a range value type command via the electrical interface 122, where a range value is determined by the input. The range value command or operation sets a numeric value between a minimum and maximum, representing a respective minimum or maximum parameter of an operational aspect of a device. In examples, the range value can represent brightness, volume, power level, fan speed, or other similar operational setting of a controlled device. In an example in which the control device 100 implements a range value type operation, control module 120 can use a detected magnitude, slide distance, and/or slide direction of the slide input to determine a final power state (e.g., dimming) for the controlled device(s) 125. The control module 120 can then implement the dimming operation via the electrical interface 122 accordingly.

In certain implementations, the location of the touch input on the touch-based control device 100 can cause the control module 120 to execute a control operation. For example, if the touch input is performed within the touch groove 116, the control module 120 can automatically interpret the touch input as a range value command or setting for a controlled device 125. In variations, the location of the touch input on the touch-based control device 100 does not matter. Rather, the characteristics of the touch input itself anywhere on the surface of the touch-based control device 100 can be interpreted consistently. In such variations, the control module 120 can perform conflict resolution functions to determine whether any particular touch input performed on the touch-based control device 100 was a tap input or a slide input.

In still further implementations, the control module 120 can interpret touch inputs performed in the surrounding exterior region 110 as on/off commands—whether the touch inputs are, for example, tap, double-tap, tap and hold, double tap and hold, or slide inputs—whereas the control module 120 can interpret between tap and slide inputs when they are performed within the touch groove 116. According to such examples, touch inputs within the touch groove 116 can be distinguished by the control module 120 as either tap inputs or slide inputs, which can cause the control module 120 to execute, for example, an on/off command, a device selection command, a mode selection command, a range value command and/or another type of command.

According to various examples, upon sensing a touch input on the surface of the control device 100 or specifically within the touch groove 116 of the touch-based control device 100, the control module 120 can execute conflict resolution logic to determine whether a particular touch input is a tap gesture or a slide gesture. For example, the conflict resolution logic may be triggered when a confidence level corresponding to the touch input is below a particular threshold (e.g., 95%). Once triggered, the control module 120 can execute the conflict resolution logic by determining whether a linear movement of the touch input exceeded a certain threshold (e.g., one centimeter). If so, then the sensing logic can interpret the touch input as a slide input and execute, for example, a command to adjust a power level of the controlled device 125 (e.g., dimming on a light element). However, if not, then the control module 120 can interpret the touch gesture as a tapping gesture and execute an on/off command, depending on the current state of the controlled device 125.

While numerous examples are described with reference to control device 100, some embodiments may be directed to the base assembly 112, which can be installed in a dwelling separately from the exterior panel 110. In examples, the base assembly 112 is structured to position the control module 120 within a threshold proximity to an exterior panel that is to be assembled onto the base assembly upon installation of the base assembly within a dwelling. The threshold proximity may be based on the range of sensitivity of the sensor layer, specifically with respect to the sensor layer detecting touch input on the exterior panel 110.

Touch Anywhere Construction

Figures 2A, 2B:
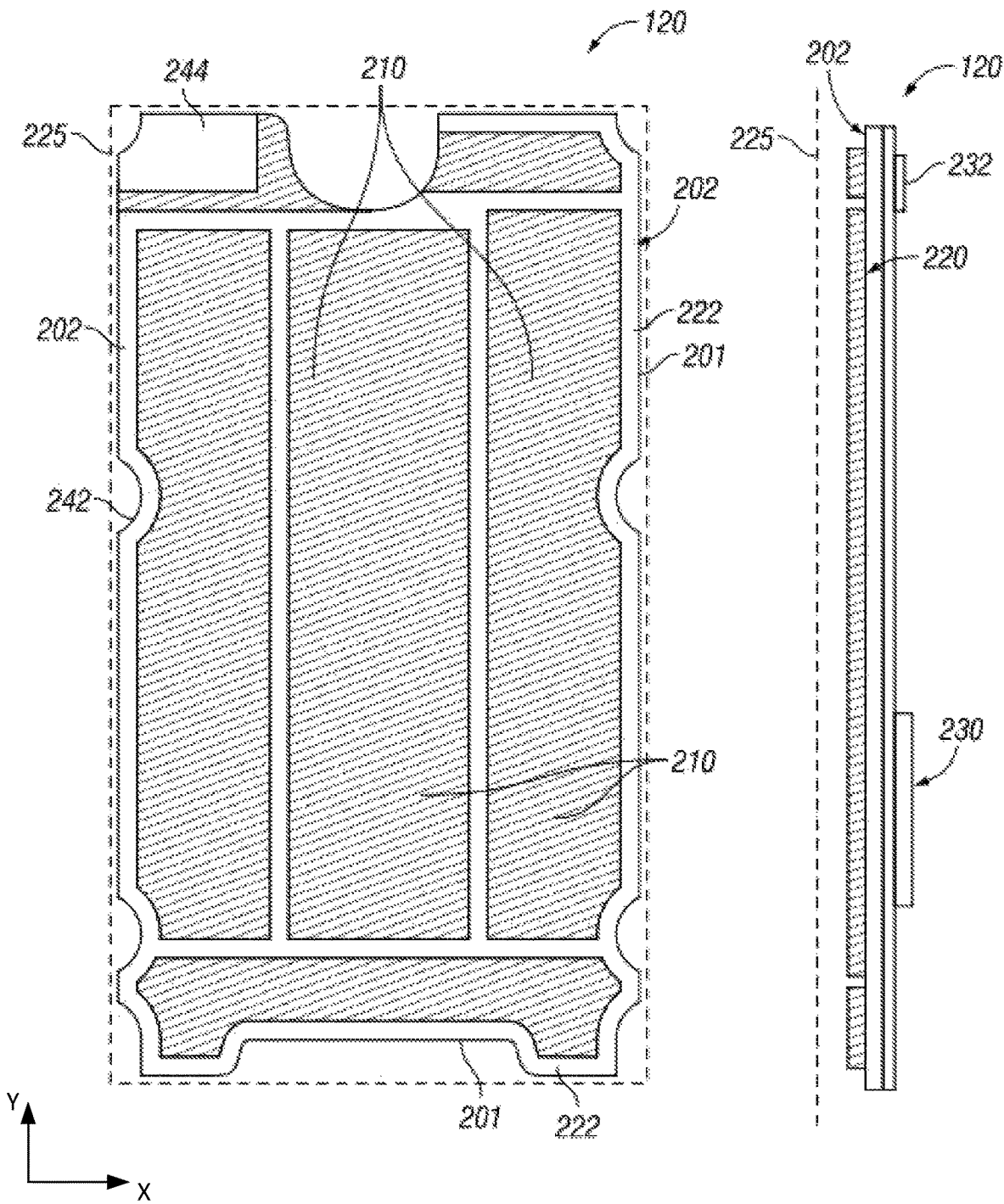
FIG. 2A is a front view of a printed circuit board (PCB) for a control module, according to one or more examples.
FIG. 2B is a side view of the PCB of FIG. 2A, according to one or more examples.
Figure 2C:
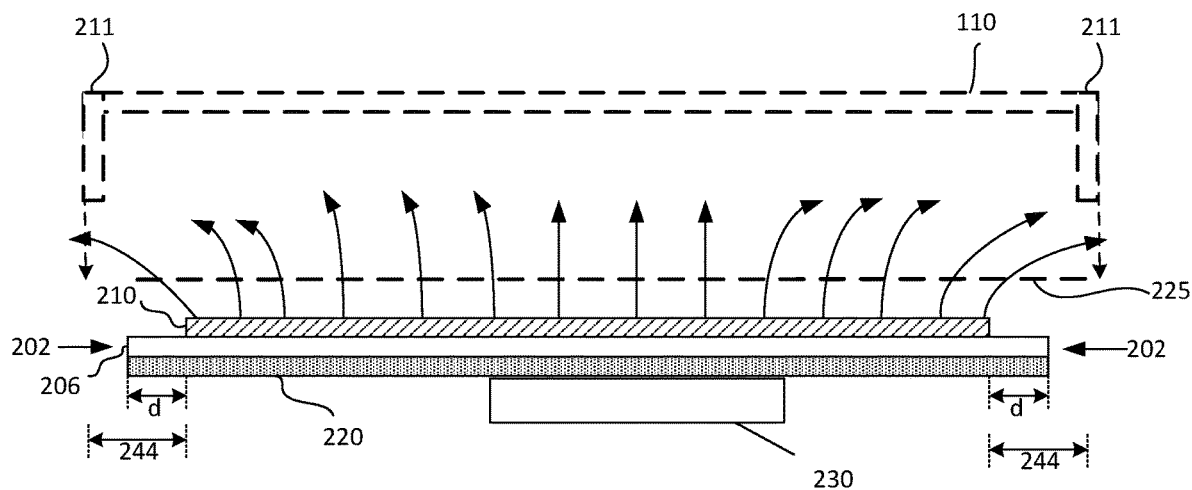
FIG. 2C is a sectional view of a control device of FIG. 2A along lines A-A, according to one or more examples.

FIG. 2A through FIG. 2C illustrate the control module 120 structured to enable control device 100 to sense touch-input on any location of the exterior panel 110, according to one or more examples. FIG. 2A is a front view of a printed circuit board (PCB) 202 for control module 120, according to one or more examples. FIG. 2B is a side view of the PCB 202 of FIG. 2A. FIG. 2C is a sectional view of the control device 100 along lines A-A, according to one or more examples.

With reference to FIG. 2A and FIG. 2B, control module 120 includes a PCB 202 having a sensing layer 210, a reference plane 220 on which the sensing layer 210 is formed, and sensing control logic 230 to detect and interpret sensor values detected by the sensing layer 210. The sensing layer 210 can be formed from conventional PCB fabrication techniques, such as by etching sensors into copper foil. In some examples, the reference plane 220 is a copper grounding plane. The sensing control logic 230 can be implemented through, for example, a microprocessor that is electrically connected to the sensing elements of the sensing layer 210. As shown, the sensing control logic 230 can be implemented by, for example, a microprocessor that is provided on a back side of the PCB 202, along with other components (e.g., wireless transceiver 232), circuit elements, and electrical interface (not show).

When installed, the exterior panel 110 can mount directly over or in close proximity to the sensing layer 210, such that the individual sensing elements of the sensing layer 210 can detect fluctuations in an electric field caused by introduction of a capacitive object, such as a human finger which inherently carries capacitance. With reference to FIG. 2A, a touch region 225 can represent an overlay region of the exterior panel 110, coinciding with the region of the exterior panel 110 where touch-input can be detected and interpreted. As shown by FIG. 2A, the touch region 225 can encompass one or multiple regions that extend over regions where no capacitive sensing elements are provided. For example, the PCB 202 may include one or more structure void regions 242, corresponding to a shape or other structural feature (e.g., through-hole) of the PCB 202 where no sensing elements exist. As an addition or variation, the touch region 225 can extend over the one or more perimeter regions 246, which can extend beyond a perimeter edge of the PCB 202 to encompass, for example, a perimeter edge or thickness of the exterior panel 110. In such examples, the control module 120 may still detect and interpret touch-input of the user, even when the touch-input does not directly overlay the sensing elements of the sensing layer 210, such as in the case when the touch-input is at or near an edge region of the exterior panel 110 so as to directly overlay an area that is beyond the perimeter edge 201 of the PCB 202.

Still further, in some implementations, the reference plane 220 can include one or more sensor void regions 244 that are intended to accommodate design aspects of the sensing layer 210. For example, the control module 120 can include a sensor void region 244 where no sensing elements are provided, so as to prevent interference with an antenna element of a wireless transceiver 234.

With reference to FIG. 2C, the PCB 202 includes sensing layer 210, a dielectric layer 206, and a reference plane 220. The reference plane 220 can be exposed ("exposed reference plane regions 222") on a perimeter region 246, with the sensing layer 210 and dielectric layer 206 having a relatively reduced dimension (as represented by d) as compared to the reference plane 220. Examples recognize that exposure of the reference plane 220 at select locations (e.g., such as near the perimeter region) causes the electric field overlaying the sensing elements of the sensing layer 210 to skew directionally, to better overlay the perimeter regions 246, which can extend beyond the perimeter edge 201 of the PCB 202 to encompass a perimeter corner or edge of the exterior panel 110. In such examples, touch-input received on the exterior panel 110 on or near a corner or perimeter region 211 is detectable and interpretable by the sensing control logic 230. In contrast, under conventional approaches, the perimeter regions 246 would be blind spots on the exterior panel 110, coinciding with locations where touch-input would be undetectable.

Accordingly, with reference to FIG. 2A through FIG. 2C, in order to allow for touch responsiveness over the entire touch region 225, examples can further provide for the PCB 202 to be structured so as to selectively expose the reference plane 220, to cause the electric field used by sensing elements that are adjacent to the exposed reference plane to be influenced in shape (e.g., bend, arc) by the exposed reference plane regions 222. In particular, examples provide for exposing the reference plane 220 about or near regions of the PCB 202 where no sensing elements are provided, such as about structure void regions 242, sensor void regions 244 and perimeter regions 246. The selective exposure of the reference plane 220 causes a greater portion of the electric field that is used by the proximate and/or adjacent sensing elements to shift laterally over and beyond the exposed reference plane regions, so as to increase the overlay of the electric fields over the structure void regions 242, sensor void regions 244 and/or perimeter regions 246. In this manner, the shifting of the electric field enables touch-input that occurs over the respective structure void regions 242, sensor void regions 244 and/or perimeter regions 246 to be detectable by the respective proximate sensing elements, such that, for example, an output of the respective proximate sensing elements is distinguishable (or more distinguishable) from a baseline reference signal that is otherwise generated by the proximate sensing elements when no touch-input occurs.

Additionally, examples provide that the sensing control logic 230 can implement logic that is specific to a particular area or location of contact on the exterior panel. In some examples, the sensitivity of the sensing control logic 230 in how it interprets raw sensor data generated from the sensing layer 210 can be tuned based on the location (e.g., X/Y coordinates) of the touch contact. For example, to detect touch contact that occurs over structure void regions 242, sensor void regions 244, and/or perimeter regions 246, the sensing control logic 230 can implement a lower threshold variance as between the detected capacitance and a baseline level for sensing layer 210. Moreover, the sensing control logic 230 may determine different types of touch-input based on the location of the touch contact (e.g., X/Y coordinate). For example, the sensing control logic 230 may detect a touch-input as a stroke or movement when the touch-input overlaps with the touch groove 116. As another example, the sensing control logic 230 can detect a touch-input as a tap, or double tap, when the touch-input occurs over one of the structure void regions.

Figure 3:
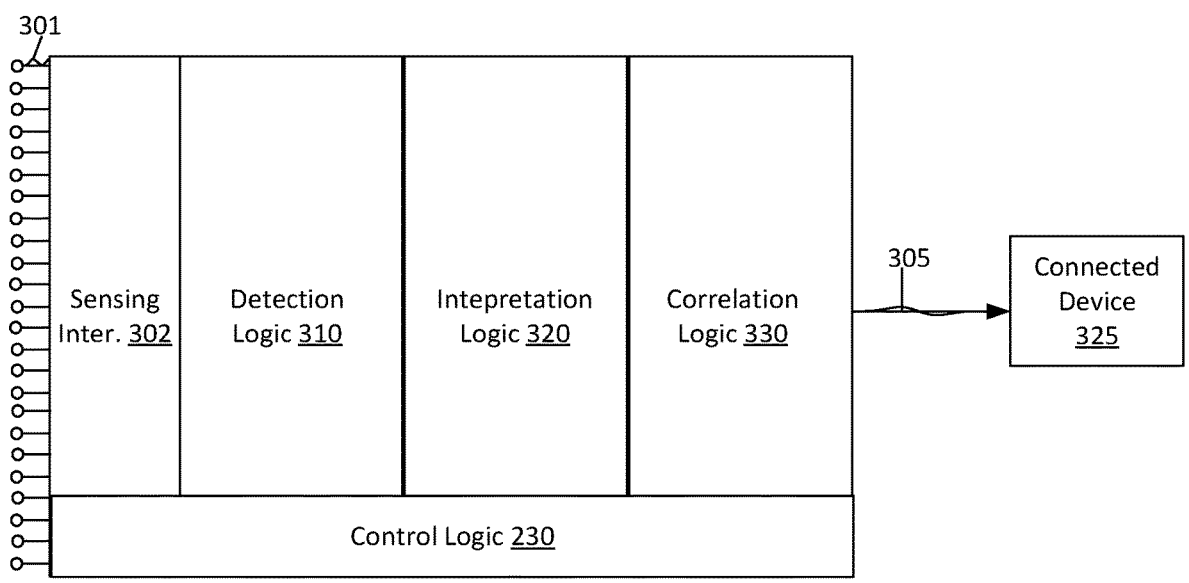
FIG. 3 illustrates sensing control logic for a control module of a touch-based control device, according to one or more examples.

FIG. 3 illustrates an implementation of sensing control logic 230, according to one or more examples. In examples, sensing control logic 230 includes an interface 302 which can receive multiple sensor signals 301, with each sensor signal 301 corresponding to an output of a respective sensing element. In some examples, the sensing control logic 230 continuously receives sensor signals 301 from the sensing layer 210, where each sensor signal 301 is generated by a sensor element or discrete portion of sensing layer 210. Accordingly, each sensor signal 301 can be associated with at least one location (e.g., coordinate) of touch region 225. Each sensor signal 301 can correspond to, for example, capacitance signals generated by an electric field above a corresponding sensing element or portion of the sensing layer 210. Without any touch-input, the sensing elements of sensing layer 210 continuously generate a baseline or noise signal, and when touch-input occurs, the sensor signals 301 that are impacted by the touch-input reflect a change as compared to the baseline signal.

In examples, the sensing control logic 230 includes detection logic 310 which can continuously monitor the sensor signals 301 to detect the occurrence of a touch-input. The detection logic 310 can detect a touch-input as a change in a value of one or more sensor signals 301, where the change is in reference to the baseline or noise signal value for the sensing element. In examples, the detection logic 310 can register a touch-input when the value of one or more sensor signals 301 varies from the baseline by more than a given minimum threshold ("touch trigger threshold").

In variations, the detection logic 310 can implement additional conditions for registering changes in values of the sensor signals 301 as touch-input. By way of examples, the additional conditions can include (i) a minimum threshold number of sensing elements that generate sensor signals 301 which vary from the baseline by more than the touch trigger threshold area; and (ii) a minimum threshold time interval during which the change in the sensor signals 301 was detected.

Additionally, in detecting touch-inputs, the detection logic 310 can implement calibration or sensitivity adjustments that are specific to the location of a sensing element. The calibration or sensitivity adjustments can be made in context of determining whether a value of a sensor signal 301, individually or in combination with other signals, is indicative of touch input as opposed to noise. In examples, the detection logic 310 incorporate calibration or sensitivity adjustments for sensor signals 301 of sensing elements that are adjacent or proximate to a location of the touch region 225 which does not directly overlay any sensing element. For example, sensor signals 301 that are generated adjacent or proximate to one of the structure void regions 242, sensor void regions 244 and/or perimeter regions 246 of the circuit board can be calibrated to reflect greater sensitivity as compared to sensor signals 301 that are generated from a region of the sensor layer which directly coincided with presence of one or multiple sensing elements. The detection logic 310 can, for example, vary the touch trigger threshold for individual sensing elements based on the location of the respective sensing elements, with the touch trigger threshold being less for those sensing elements that are proximate to one of the structure void regions 242, sensor void regions 244 and/or perimeter regions 246. In this way, the detection logic 310 can be more sensitive to touch-inputs which occur on locations of the touch region 225 that do not, for example, overlay a sensing element (e.g., location beyond perimeter edge of PCB 202).

Still further, some examples recognize that a touch-input can impact the sensor signals 301 of multiple sensing elements (e.g., cluster) at one time, and over a given time interval during which the touch-input occurred, the number of sensing elements and the degree to which they are impacted may range based on attributes of the touch-input. In determining whether touch input occurs, detection logic 310 can process the sensor signals 301 for attributes which are indicative of a potential touch event, and the attributes can be analyzed to determine whether a touch input occurred. The attributes can reflect, for example, (i) the number of sensing elements which modulate, such as by having outputs that vary by more than a predetermined threshold as compared to a baseline output of the sensor element, (ii) the variation amongst the modulated sensor signals 301, (iii) the degree and/or duration to which the sensor signals 301 are modulated, and/or (iv) the location of the sensing elements that generated the modulated sensor signals 301. The detection logic 310 can incorporate calibration or sensitivity adjustments based on the location of the sensing elements from which respective modulated sensor signal 301 are detected. In some examples, the calibration or sensitivity adjustments can include weighting one or more attributes that are determined from sensing signals 301 that are near a void or perimeter region where no other sensing element is provided. As an addition or variation, the detection logic 310 can pattern match detected attributes of sensor signals 301, such as by (i) representing attributes of a number of modulated signals as a feature vector, and (ii) comparing the determined feature vector with known feature vectors that are labeled to reflect input or no input (or alternatively, a particular type of input). In this way, the detection logic 310 can associate a touch-input that includes attributes such as the location of the touch-input at multiple instances of time during an interval when the touch-input was detected.

In examples, the sensing control logic 230 may also include touch interpretation logic 320, which can associate the detected attributes associated with the touch-input with an input type and/or value. By way of example, the determined input types or values can correspond single-tap, double-tap, long touch, slide or swipe, etc. In some variations, the input type and/or value can also be associated with one or more location values. For example, a touch-input in a first region of the touch region 225 may be interpreted differently as compared to the same touch-input in a second region of the touch region 225.

In examples, the sensing control logic 230 can include correlation logic 330 to correlate the sensor change value, the detected attributes and the input type to an output signal 305. The output signal 305 can be selected for one of multiple controlled devices 325. Additionally, the output signal 305 can specify a setting or command based on the connected device 325. In some variations, the output signal can be specific to the type or functionality of the connected device 325.

In examples, the sensing control logic 230 may also include touch interpretation logic 320, which can associate the detected attributes associated with the sensor signals 301 with an input type, characteristic and/or value. By way of example, the determined input types or values can correspond to single-tap, double-tap, long touch, slide or swipe, two-dimensional gesture, etc. In examples, the touch interpretation logic 320 can associate attributes of sensor signals 301 reflecting touch input as occurring at multiple proximate but distinct locations over a given time interval as a particular type of touch input, such as a swipe or other gesture. The touch interpretation logic 320 can further detect, based on the attributes of sensor signals 301 at multiple proximate but distinct locations, instances when a touch input reflects a touch input path that is indicative of other gestures, such as "S" shaped gestures. Still further, the touch interpretation logic 320 can associate attributes of sensor signals 301 reflecting touch input as occurring at the approximate same location but at distinct time intervals (e.g., separated by 0.5 seconds or less) as multi-tap inputs.

Still further, in some examples, the touch interpretation logic 320 can interpret one or more characteristics of the touch input based on determined attributes of the sensor signals 301. By way of example, the interpretation logic 320 can determine characteristics of the touch input that include (i) a direction of the movement, (ii) a length of movement, (iii) a linear path (or shape) of the touch input, (iv) a duration of the touch input, (v) a time interval between discrete touches of the touch input, (vi) a velocity or acceleration of movement of the touch input, and/or (vii) other characteristic of location and movement of the touch input.

In some variations, the input type, command and/or value which the interpretation logic 320 determines from a touch input can also be associated with one or more location values. For example, a touch-input in a first region (e.g., top half surrounding touch groove 116) of the touch region 225 may be interpreted differently as compared to the same touch-input in a second region (e.g., bottom half surrounding touch groove 116) of the touch region 225.

In examples, the sensing control logic 230 can include correlation logic 330 to correlate the detected attributes of the sensor signals, as well as the input type, characteristics and/or value to an output signal 305. The output signal 305 can be selected for one of multiple controlled devices 325 (e.g., light(s), ceiling fan, thermostat, appliance, security camera, television, media system or other types of devices)). Additionally, the output signal 305 can specify a setting or command based on the controlled device 325. In some variations, the output signal can be specific to the type or functionality of the controlled device 325.

Among other advantages, examples such as described with FIGS. 2A-2C and 3 enable the control device 100 to detect and interpret multiple types of touch input at any location of the exterior panel 110. In this way, the ability of the control module 120 to detect and interpret touch input is not hindered by "blind spots" which would hinder responsiveness and accuracy under conventional implementations. Moreover, the control module 120 can detect and interpret different types of touch input which utilize perimeter and edge regions of the exterior panel 110. As a result, the control device 100 can be responsive to inputs of users in context of many scenarios which are common to wall-mounted devices, such as, for example, (i) users casually approaching or walking past the control device, and (ii) users reaching to touch the control device 100, such as from a sitting position, or as a result of the user being a child.

Example Touch-based Control Device

Figure 4:
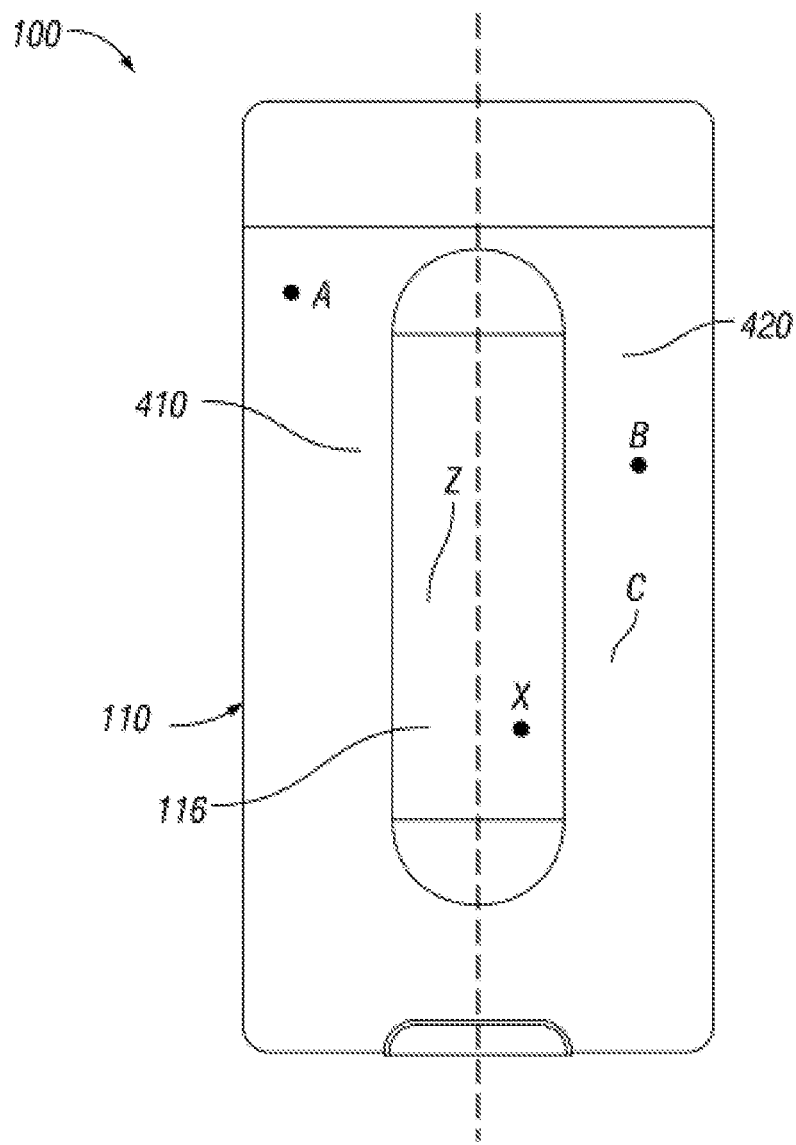
FIG. 4 illustrates various touch inputs performed by a user on a touch-based control device, according to various aspects described herein.

FIG. 4 illustrates examples of touch-based control device 100, according to various aspects described herein. The touch-based control device 100 can associate different regions on the exterior panel 110 with different inputs (e.g., input types or devices that may be controlled). In some examples, the control module 120 logically partitions the touch region 225 and/or exterior panel 110 into predefined regions. For example, the logical partitions of the touch region 225 can correspond to (i) a region of the touch groove 116, and (ii) a region of the exterior panel 110 which surrounds the touch groove 116. In variations, the region of the exterior panel 110 can include sub-regions (e.g., top and bottom regions, or top-left, top-right, bottom-left and bottom right regions). Likewise, the region of the touch groove 116 can also be logically partitioned—for example, the region of the touch groove 16 can include top and bottom sub-regions and/or edge and mid-regions.

With reference to an example of FIG. 4, the control module 120 logically partitions the touch region 225 to define regions of the exterior panel 110, including left region 410, right region 420, and touch groove 116. The control module 120 can be configured to, for example, interpret touch input received on the panel 110 in accordance with interpretation logic associated with each of the predefined regions of the panel 110. Additionally, the control module 120 can be configured to interpret touch input based at least in part on the type of touch input, such as whether the touch input is a tap, double tap, triple tap, slide, or other continuous gesture. Further, for at least some kinds of touch input, the control module 120 can determine a value associated with the touch input, using attributes detected from the touch input.

In various examples, the operation associated with a tap can be interpreted based on a detected region of the exterior panel 110 where the tap occurred. In certain implementations, the touch-based control device 100 can be configured (based on user-input) to interpret tap A, which occurs in the left region 410 of the panel 110 differently as opposed to tap B that occurs in a right region 420 of the panel 110. For example, tap A in the left region 410 can be interpreted as an on/off operation for a first controlled device 125, and tap B in the right region 420 can be interpreted as an on/off operation for a second controlled device 125.

In certain examples, slide Z in the touch groove 116 can be interpreted as a power level command (e.g., dimming for lights) or other range value command, with the power level command being affected by one or more of (i) a direction of the movement, (ii) a starting position and ending position (or length of movement), (iii) a velocity of movement, and/or (iv) other characteristic of location and movement of the touch input. Additionally, in some variations, tap X in the touch groove 116 can also be interpreted as an on/off command. Alternatively, the tap input X can be interpreted as a power level or other range value command when inputted in the touch groove 116. In such an example, a location of tap input X within the groove (in this case a lower portion of the groove) can determine how much the controlled device 125 is to be dimmed. For tap inputs within a center region of the touch groove, the power level or other range value command can be more moderate compared to tap inputs towards the edges of the touch groove 116.

In some examples, the control module 120 can include logic to detect ambiguous touch inputs from the user. For example, the user can provide an ambiguous touch input, such as quasi-slide input C outside of the touch groove 116. In such an example, the quasi-slide input can be interpreted as either a slide input or a tap input within or near the touch groove 116. The control module 120 can employ settings, user preferences, or rules to interpret quasi-slide input C based on the location of detection and/or the linear movement of the input. For example, ambiguous input C can be interpreted by the control module 120 as either a tap input or a slide input based on a conflict resolution operation performed by the control module 120.

In certain aspects, ambiguous input C would be weighted in favor of a slide input if the touch input occurs within the touch groove 116. However, when ambiguous input C occurs on the exterior panel 110, as shown in FIG. 4, the input may be weighted more in favor of a tap input. Thus, the location of the touch input can cause the control module 120 to weight or influence the interpretation of whether the input is a tap or a slide input. In certain examples, a slide input performed by the user outside of the touch groove 116 can be ignored, interpreted as an alternative input (e.g., a tap input), or interpreted as a slide input. Likewise, a slide input that starts within or near the touch groove 116 and ends outside of the touch groove 116 can be interpreted as a slide, a tap, or other input based on the settings, user preferences, or rules.

Methodology

Figure 5:
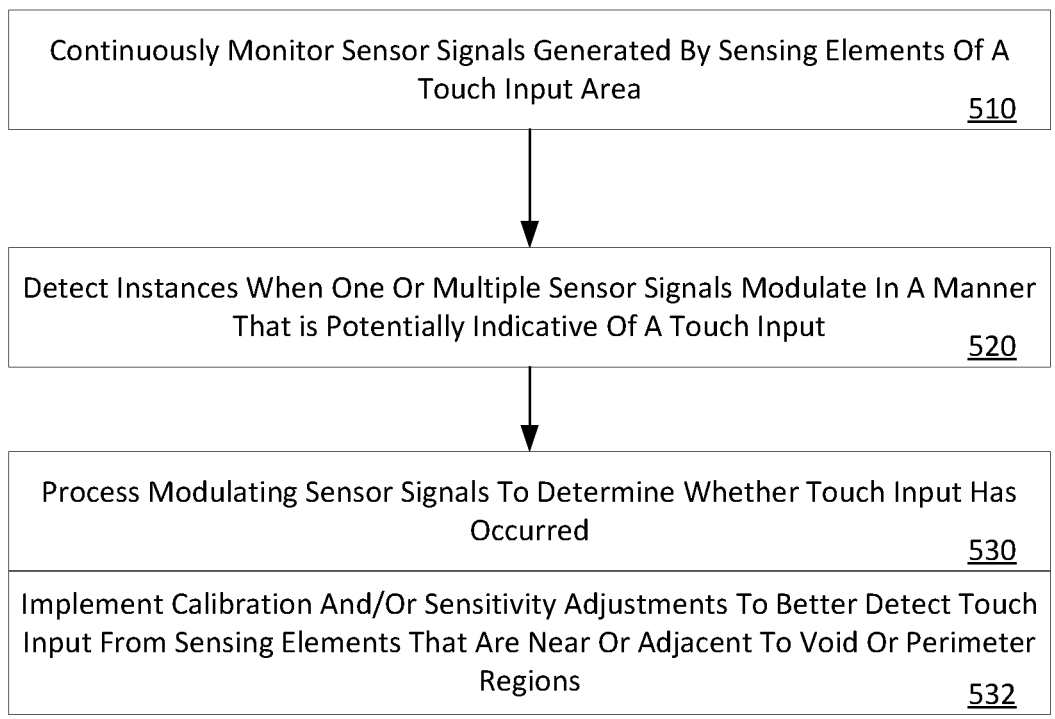
FIG. 5 illustrates an example method for operating a touch-based control device, according to one or more examples.
Figure 6A:
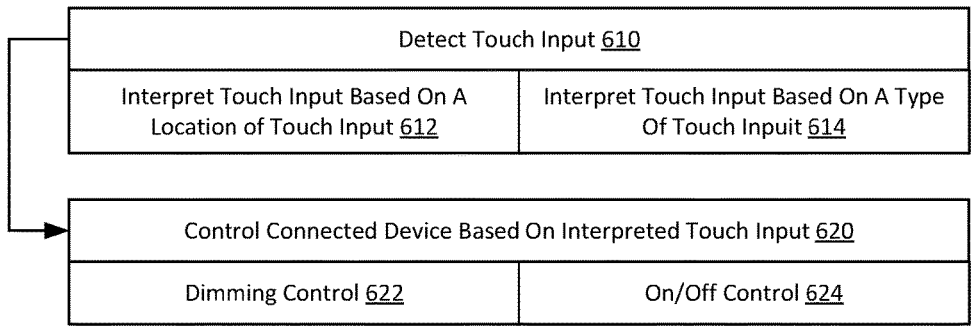
FIGS. 6A and 6B are flow charts describing methods of controlling one or more controlled devices by a control device, according to one or more examples.
Figure 6B:
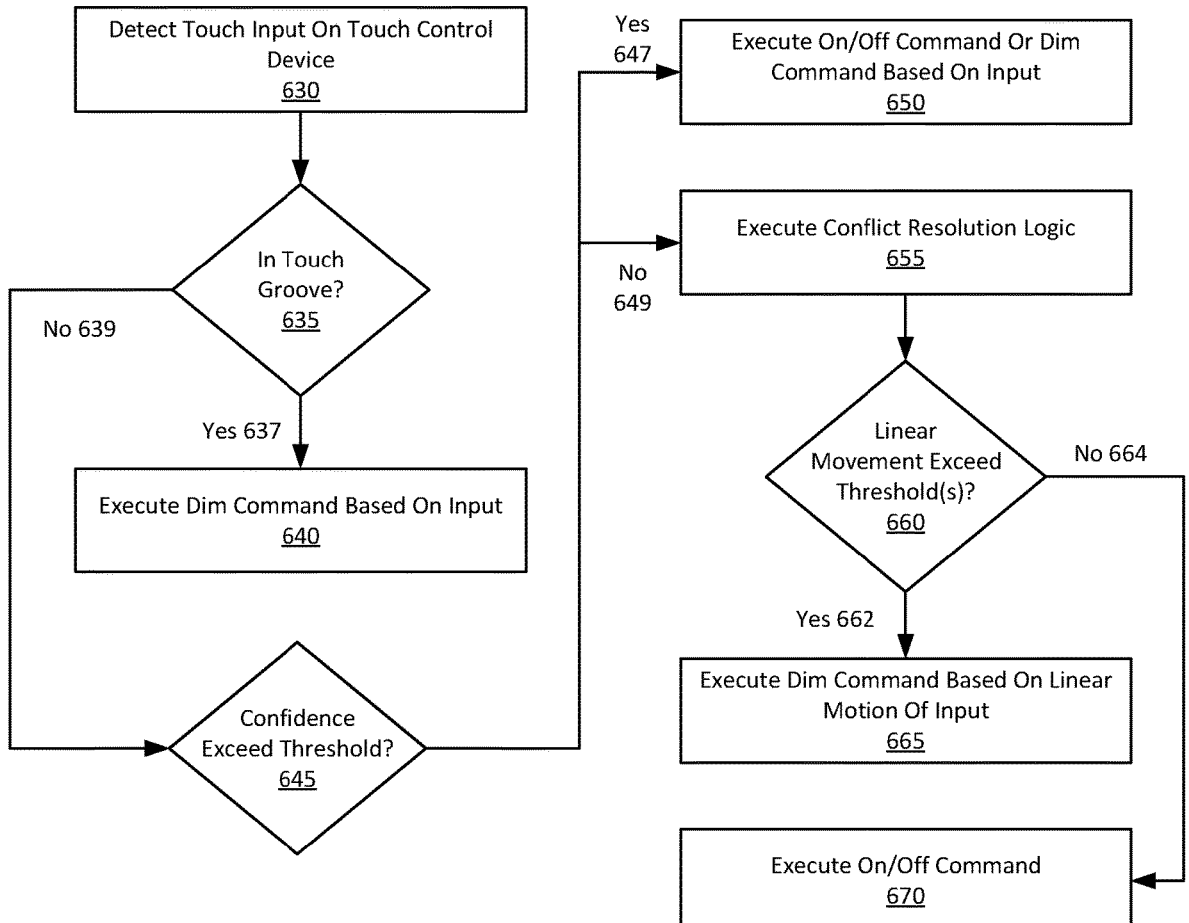

FIG. 5 illustrates a method of operating a touch-based control device, according to one or more examples. FIGS. 6A and 6B illustrate methods for operating a touch-based control device to control one or more devices (e.g., lights) by a control device, according to one or more examples. In describing the examples of FIGS. 5, 6A and 6B, reference may be made to various elements as shown and described with respect to FIG. 1A, FIG. 1B and elsewhere in this application, for purpose of illustrating steps or sub-steps being described.

According to examples, the control module 120 continuously monitors sensor signals 301 generated by sensing elements of the sensing layer 210 (510). The control module 120 can further detect instances when one or multiple sensor signals 301 modulate in a manner that is potentially indicative of a touch-input (520). For example, the control module 120 can detect when the modulating sensor signal(s) 301 exceed a corresponding baseline value by an amount which exceeds the touch trigger threshold.

The control module 120 can process the modulating sensor signals 301 to determine whether a touch input has occurred (530). Further, in making the determination, the control module 120 can implement calibration and/or sensitivity adjustments that are based on the location of the sensor signals 301 (532). In particular, the control module 120 can implement the calibration and/or sensitivity adjustments so that modulated sensor signals 301, resulting from one or multiple sensing elements that are adjacent to a void or perimeter region, can properly be detected and interpreted as touch input.

As an addition or alternative, the control module 120 can analyze modulating sensor signal(s) 301 to identify attributes that include (i) a number of modulating sensing elements, (ii) the variation amongst the modulated sensor signals 301, (iii) the degree and/or duration to which the sensor signals 301 are modulated, and (iv) the location of the modulated sensor signals 301. Additionally, the control module 120 can weight attributes determined from sensing elements that are proximate or adjacent void or perimeter regions to reflect more sensitivity, so as to better detect touch-input that occurs over a void or perimeter region.

Among other advantages, examples such as described with FIG. 4 and elsewhere in this application enable touch input to be detected at any location of a touch input region, without so-called blind spots that would otherwise hinder responsiveness under conventional approaches.

Referring to FIG. 6A, touch-based control device 100 operates to detect touch input received on any part of the exterior panel 110, including the touch groove 116 (610). In some examples, the control device 100 can detect touch input that is received on any location of the exterior panel 110. Still further, in variations, the control device 100 detects touch input received at any location over a substantial portion of the exterior panel 110.

The control device 100 interprets the touch input based on at least one of a location of the touch input (612) and/or a type of touch which occurred (614). For example, the control module 120 can partition the touch region 225 into sub-regions, and further interpret the touch input based at least in part on the sub-region or sub-regions of the touch region 225 where the input is detected. As an addition or variation, the control module 120 can interpret the touch input based on type, such as whether the touch input is a tap input, double-tap, triple-tap, slide input or other gesture input. To interpret the type of input, the control module 120 can detect one or more attributes of the touch input, such as control module 120

In examples, the type of touch input can be based on one or more detected characteristics of the touch input. In variations, the detected characteristics of the touch input can correspond to (i) a length or other dimension of the touch input, (ii) a duration of the touch input, (iii) a direction of the input, and/or (iv) a shape, pattern or other gesture formed by the touch input. In other variations, the detected attributes of the touch input can correspond to such as a touch force exerted on the surface (e.g., such as may be detected by use of a force sensor), a velocity of the touch input (e.g., speed of a swipe), and/or acceleration of the touch input.

In various implementations, the touch-based control device 100 controls a set of connected device, based on the interpreted touch input (620). By way of example, each of the set of controlled devices includes a light, a ceiling fan, a thermostat, an appliance, a wireless receiver (to control other devices) and/or a media device. In other examples, the set of connected device includes a wireless transceiver for another device (e.g., for a light). Based on the interpreted input, the control device 100 implements one of a range value command, such as to set a power level of a connected device. In an example of FIG. 2, the control device implements dimming control (622) or on/off control (624) for a connected set of lights. When implementing range value control, the control module 120 can utilize characteristics of the touch input to determine the range value. For example, the characteristics of the touch input can be used to determine the dimming output level of the connected light(s), between a range (e.g., lowest to highest luminosity). The characteristics of the touch input to affect the range value command can include, for example, the length of slide, the starting location and/or ending location of the slide, a duration of the slide, and/or a velocity of the slide.

In some examples, the control module 120 can execute sensing and control logic to facilitate the user in interacting with the touch-based control device 100. By way of example, the control module 120 can interpret detected touch as follows:

(i) If the touch input is detected as occurring within the touch groove 116, then the control module 120 determines whether the touch input comprises a tap or a slide (or other gesture). If the touch input is a tap, the control module 120 interprets the touch input as on/off input. If the touch input is a slide, the control module 120 interprets the touch input as a range value command, where a range value is determined by the touch input.

(ii) If the touch input is detected as occurring in a region surrounding the touch groove 116, then the control module 120 does not interpret the touch input as a slide for determining a range value.

In examples, the operation associated with a tap can be configurable, or user-selected. Thus, for example, the user can select one of multiple controlled devices 125 (e.g., lights) to switch on/off using a tap. In such examples, the user can configure the touch-based control device 100 to operate a particular controlled device 125, through an application interface on the user's mobile computing device (e.g., for wirelessly connected smart bulbs). In variations, the touch-based control device 100 can be hardwired to control power output to one or more load devices, such as light elements, using existing home wiring, as described herein.

FIG. 6B is a flow chart describing an example method of executing conflict resolution logic to generate a command for a controlled device 125 (e.g., a light), according to various examples. Referring to FIG. 6B, the control module 120 detects a touch input on the touch-based control device 100 (630). In certain implementations, the control module 120 can initially determine whether the touch input is performed within the touch groove 116 (635). If so (637), then the control module 120 can execute an alternative command, such as a power level command (e.g., a dim command on the light element) based on the characteristics of the input (e.g., a linear direction and distance of the slide input) (640).

However, if the touch input is performed on the surrounding exterior panel 110 (639), outside of the touch groove 116, then the control module 120 can determine whether the touch input is a tap input or a slide input. In certain examples, the touch input may include a slight linear aspect (e.g., a few millimeters), but the execution of the sensing logic by the control module 120 may not result in the requisite confidence level to execute a command. In such instances, the control module 120 can first determine whether the touch input exceeds a threshold confidence level (e.g., 95%) (645). If so (647), then the control module 120 can execute an on/off command or a range value command based on the nature of the input (e.g., whether the input is a tap input or a slide input) (650). However, if the touch input does not exceed the confidence level threshold (649), then the sensing module can execute conflict resolution logic to determine the nature of the input (655).

As provided herein, execution of the conflict resolution logic can cause the control module 120 to determine whether a linear movement of the touch input exceeds a time threshold (e.g., a tenth of a second), a certain distance threshold (e.g., half a centimeter), and/or distance and pressure threshold (e.g., a minimum applied force on the panel) over the course of the linear movement (660). If the threshold(s) is/are exceeded (662), then the control module 120 can execute a range value command based at least in part on the linear motion of the slide input (665). However, if the threshold(s) is/are not exceeded (664), then the control module 120 can execute an on/off command for the controlled device 125 based on a current state of the controlled device 125 (670).

Hardware Diagram

Figure 7:
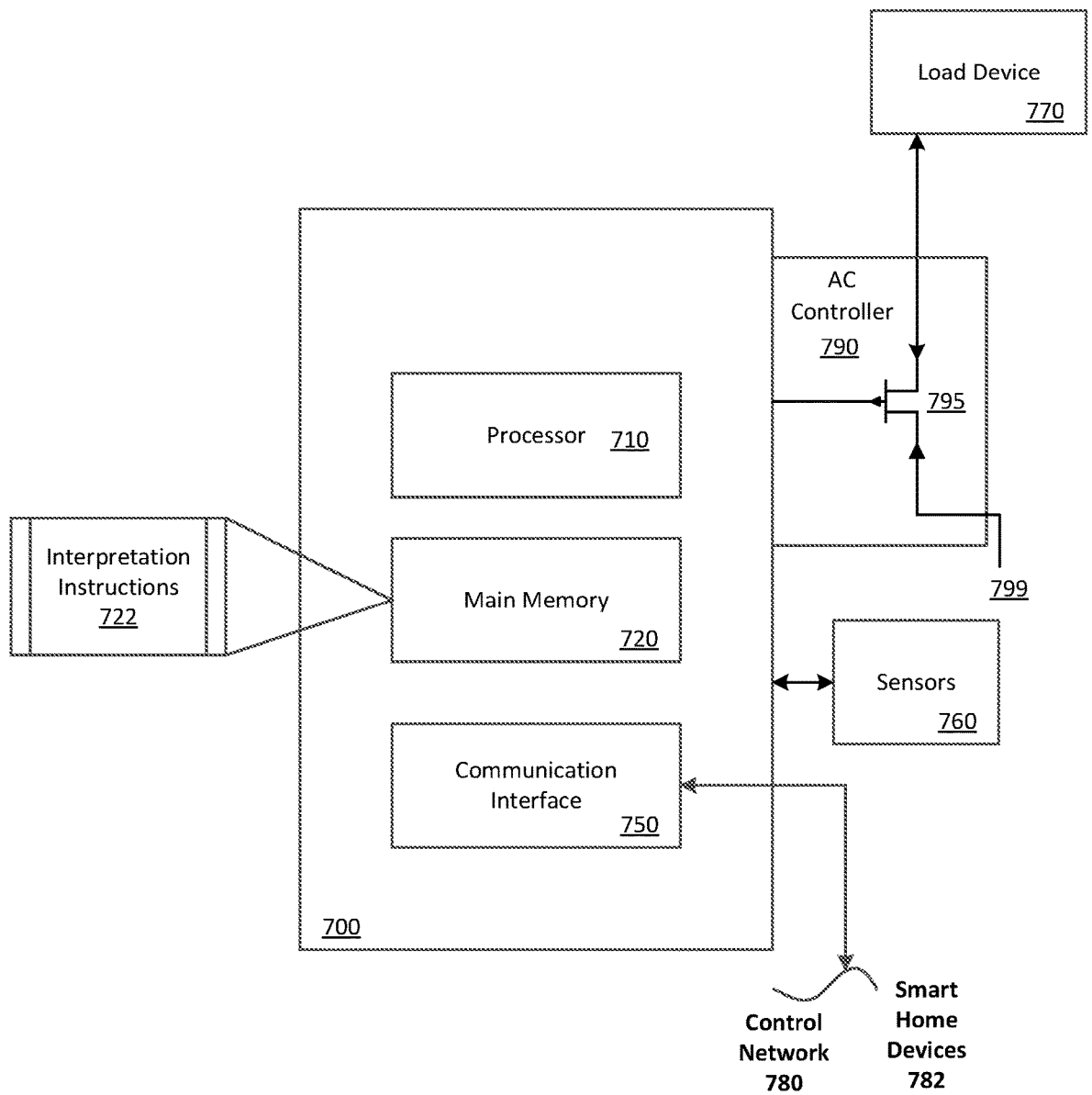
FIG. 7 is a hardware diagram illustrating a processing device upon which example control devices described herein may be implemented.

FIG. 7 is a hardware diagram of a touch-based control device, according to one or more examples. In various examples, the control device 700 can comprise the logic and processing performed via user interaction with the touch-based control device 100 as shown and described with various examples of the disclosure. In one implementation, the control device 700 includes processing resources 710, a memory 720, and a communication interface 750. The control device 700 includes at least one processor 710 for processing information stored in the main memory 720, such as provided by a random-access memory (RAM) or other dynamic storage device, for storing information and instructions which are executable by the processor 710.

As provided herein, a control module 120 of the touch-based control device 100 can comprise the processor 710 or combination of the processor 710 and main memory 720 as shown and described with respect to FIG. 7. In various embodiments, the control module 120 may be a general-purpose microprocessor, a microcontroller, a combination of one or more microprocessors and/or microcontrollers acting in concert, and/or a touch sensor specific integrated circuit incorporating, or connected to, one or more of these processing configurations. The main memory 720 also may be used for storing temporary variables or other intermediate information during execution of instructions to be executed by the processor 710. The memory may also include ROM or other static storage device for storing static information and instructions for the processor 710.

The communication interface(s) 750 can enable the control device 700 to communicate over one or more control networks 780 (e.g., Bluetooth, Zigbee, Wi-Fi, etc.) through use of one or more wireless network links. Using the network links, the control device 700 can communicate with one or more home devices, one or more servers, or third-party intermediary communication modules. The executable instructions in the memory 720 can include interpretation instructions 722, which the computing device 700 can execute to detect and interpret input performed by users on the surface (exterior panel 110) of the control device 700. The control device 700 can implement control operations in response to detecting and interpreting touch input. For example, the processor 710 can execute the instructions 722 to interpret sensor signals generated by a layer of touch sensors 760 which are provided underneath the exterior panel 110. In response to detecting and interpreting touch input, the control device 700 generates control commands and performs other control operations to implement a setting or other operational aspect of the controlled device.

The executable instructions stored in memory 720 can also include control connectivity instructions (not shown), which the control device 700 can execute to selectively connect the communication interface 750 to various smart home devices, in order to transmit, either directly or through an intermediary, control command(s) of the processor 710. As described herein the control device 700 may be connected via a wired connection to one or more load devices 770, or can implement wireless network protocols to connect with smart home devices 782 via the control network 780 to transmit the control commands.

In some embodiments, the computing device 700 may be coupled to AC controller 790, for example by clips that provide for an electrical connection to be made between spring clips or pogo pins on one side (e.g., the home controller or the AC controller 790) and electrically conductive pads on the corresponding side. AC controller 790 may include connections to wall wiring for line, load, neutral, and/or ground wires, and in some embodiments, may include L1 and L2 outputs for 3-way configurations. In some embodiments, AC controller 790 may include an AC microcontroller which receives instructions from the control device 700, and which may control field effect transistors, triac(s), switching and/or other dimming mechanisms, for example as discussed above. In certain examples, the AC controller 790 can include a dimming FET 795 connecting the AC controller 790 to a line wire and load wire of existing wiring (e.g., of a light switch). In the example shown in FIG. 7, the load wire connects the AC controller 790 to the one or more wired home devices 770 (e.g., lights), and the line wire connects the AC controller 790 (a touch-based control device 100) to a power source 799.

The processor 710 is configured with software and/or other logic to perform one or more processes, steps and other functions described with implementations, such as described with respect to various examples of the disclosure. Examples described herein are related to the use of the computing device 700 for implementing the techniques described herein. According to one example, those techniques are performed by the computing device 700 in response to the processor 710 executing one or more sequences of one or more instructions contained in the main memory 720. Such instructions may be read into the main memory 720 from another machine-readable medium. Execution of the sequences of instructions contained in the main memory 720 causes the processor 710 to perform the process steps described herein. In alternative implementations, hard-wired circuitry may be used in place of or in combination with software instructions to implement examples described herein. Thus, the examples described are not limited to any specific combination of hardware circuitry and software.

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature. Thus, the absence of describing combinations should not preclude claiming rights to such combinations.

What is claimed is:

1. A control device comprising:
    an exterior panel comprising multiple regions, including a first region and a second region that is different than the first region;
    a sensor layer comprising one or more sensors to detect touch inputs performed on any of the multiple regions of the exterior panel; and
    a control module configured to operate a plurality of devices, the control module being configured to:
        detect, using the one or more sensors of the sensor layer, a first touch input performed by a user on the first region of the exterior panel;
        in response to detecting the first touch input being performed on the first region, perform each of (i) determine a first set of characteristics for the first touch input, (ii) interpret the first touch input as a first command based on the first set of characteristics, and (iii) transmit the first command to control a first device of the plurality of devices;
        detect a second touch input performed by the user on the second region of the exterior panel;
        in response to detecting the second touch input being performed on the second region, perform each of (i) determine a second set of characteristics for the second touch input, the second set of characteristics being different than the first set of characteristics, (ii) interpret the second touch input as a second command based on the second set of characteristics, and (iii) transmit the second command to the first device or to a second device of the plurality of devices; and
    wherein the control module implements a calibration or sensitivity adjustment when interpreting at least one of the first touch input or the second touch input, based at least in part on a respective location of the first touch input or the second touch input.

2. The control device of claim 1, wherein the control module further interprets each of the first touch input and the second touch input as being at least one of (i) a range value command, (ii) a device selection command, (iii) a mode selection input, or (ii) an on/off command.

3. The control device of claim 1, wherein the plurality of devices includes one or more of a lighting device, a ceiling fan, a thermostat, an appliance, or a media device.

4. The control device of claim 1, wherein the control module is further configured to interpret (i) the first touch input as a range value command to set a range value of the first device when the first touch input is detected in the first region, and (ii) the second touch input as an on/off command for the first device or the second device.

5. The control device of claim 4, wherein the range value command sets an output level for the first device.

6. The control device of claim 4, wherein first touch input is detected as a slide gesture, and the second touch input is detected as a tap gesture that occurs in the second region.

7. The control device of claim 1, wherein the first region includes a groove region formed on the exterior panel, and wherein the second region includes a flat region of the exterior panel.

8. The control device of claim 7, wherein the first set of characteristics include a direction of the first touch input.

9. The control device of claim 7, wherein the first set of characteristics include at least one of a slide direction or a distance of the first touch input.

10. The control device of claim 1, wherein the control module is configured in part by user input to interpret the first touch input and the second touch input.

11. The control device of claim 1, wherein the first region corresponds to a left region and the second region corresponds to a right region, and wherein the control module implements first logic to interpret input received on the left region, and second logic to interpret input received on the right region.

12. The control device of claim 1, wherein the control module detects a user input performed at any location of the exterior panel.

13. The control device of claim 1, wherein the control device is wall-mountable.

14. A base assembly for a wall-mountable control device, the base assembly comprising:
    a sensor layer comprising one or more sensors;
    a control module being operable to control a set of devices based on sensor data received from the one or more sensors; and
    an exterior panel disposed over the sensor layer, the exterior panel being assembled onto the base assembly upon installation of the base assembly;
    wherein the control module is configured to:
        detect, using the one or more sensors of the sensor layer, a first touch input performed by a user on a first region of the exterior panel;
        in response to detecting the first touch input being performed on the first region, perform each of (i) determine a first set of characteristics for the first touch input, (ii) interpret the first touch input as a first command based on the first set of characteristics, and (iii) transmit the first command to control a first device of the set of devices;

in response to detecting a second touch input being performed on a second region of the exterior panel, perform each of (i) determine a second set of characteristics for the second touch input, the second set of characteristics being different than the first set of characteristics, (ii) interpret the second touch input as a second command based on the second set of characteristics, and (iii) transmit the second command to the first device or to a second device of the set of devices; and wherein the control module implements a calibration or sensitivity adjustment when interpreting at least one of the first touch input or the second touch input, based at least in part on a respective location of the first touch input or the second touch input.

15. The base assembly of claim 14, wherein the control module further interprets each of the first touch input and the second touch input as being at least one of (i) a range value command, (ii) a device selection command, (iii) a mode selection input, or (ii) an on/off command.

16. The base assembly of claim 14, wherein the control module is further configured to interpret (i) the first touch input as a range value command to set a range value of the first device when the first touch input is detected in the first region, and (ii) the second touch input as an on/off command for the first device or the second device.

17. The base assembly of claim 16, wherein first touch input is detected as a slide gesture, and the second touch input is detected as a tap gesture that occurs in the second region.

18. The base assembly of claim 14, wherein the first region includes a groove region formed on the exterior panel, and wherein the second region includes a flat region of the exterior panel.

19. The base assembly of claim 18, wherein the first set of characteristics include a direction of the first touch input.

20. The base assembly of claim 18, wherein the first set of characteristics include at least one of a slide direction or a distance of the first touch input.

* * * * *